United States Patent
Komai et al.

(10) Patent No.: US 7,635,501 B2
(45) Date of Patent: Dec. 22, 2009

(54) EXHAUST PIPE HAVING MEANS FOR PREVENTING DEPOSITION OF A REACTION BY-PRODUCT AND METHOD FOR PREVENTING DEPOSITION OF A REACTION BY-PRODUCT

(75) Inventors: Tetsuo Komai, Fujisawa (JP); Norihiko Nomura, Fujisawa (JP)

(73) Assignee: Ebara Corporation, Tokyo (JP)

( * ) Notice: Subject to any disclaimer, the term of this patent is extended or adjusted under 35 U.S.C. 154(b) by 1194 days.

(21) Appl. No.: 10/203,804

(22) PCT Filed: Feb. 14, 2001

(86) PCT No.: PCT/JP01/01000

§ 371 (c)(1),
(2), (4) Date: Nov. 5, 2002

(87) PCT Pub. No.: WO01/59177

PCT Pub. Date: Aug. 16, 2001

(65) Prior Publication Data
US 2003/0136365 A1    Jul. 24, 2003

(30) Foreign Application Priority Data
Feb. 14, 2000    (JP) .............................. 2000-035045

(51) Int. Cl.
*C23C 16/00*    (2006.01)
(52) U.S. Cl. ..................... 427/248.1; 427/569; 118/722; 118/50
(58) Field of Classification Search ............... 427/248.1
See application file for complete search history.

(56) References Cited

U.S. PATENT DOCUMENTS 5,819,683 A * 10/1998 Ikeda et al. .................. 118/724
5,935,283 A    8/1999 Sweeney et al.

FOREIGN PATENT DOCUMENTS

| EP | 811413 |  | 12/1997 |
|----|--------|--|---------|
| EP | 811413 | A2 * | 12/1997 |
| JP | 60-136220 |  | 7/1985 |
| JP | 1-309315 |  | 12/1989 |
| JP | 4-11628 |  | 3/1992 |

(Continued)

*Primary Examiner*—David Turocy
(74) *Attorney, Agent, or Firm*—Wenderoth, Lind & Ponack, L.L.P.

(57) ABSTRACT

An exhaust pipe (10) includes an inner cylinder (11) having an exhaust gas passage (10') formed therein, an outer cylinder provided outside the inner cylinder with a gap (15) being formed therebetween and a heating device (13) attached to the inner cylinder 11. The gap (15) is communicated with the exhaust gas passage (10'). When a gas is discharged from the reaction vacuum chamber, a vacuum is created not only in the exhaust gas passage (10') but also in the gap (15). Therefore, release of heat from the heating device to the outside can be suppressed. Consequently, the inner cylinder (11) can be efficiently heated to a sufficiently high temperature, thus preventing deposition and accumulation of a substance contained in the discharged gas on the inner surface of the inner cylinder (11). The deposition and accumulation of such a substance can also be prevented by forming a gas flow layer (18) of, for example, an inert gas, along the inner surface of the inner cylinder (11.

4 Claims, 4 Drawing Sheets

FOREIGN PATENT DOCUMENTS

| | | |
|---|---|---|
| JP | 10-73078 | 3/1998 |
| JP | 2000-252273 | 9/2000 |
| WO | 99/46027 | 9/1999 |
| WO | WO 9946027 A1 * | 9/1999 |

* cited by examiner

EXHAUST PIPE HAVING MEANS FOR PREVENTING DEPOSITION OF A REACTION BY-PRODUCT AND METHOD FOR PREVENTING DEPOSITION OF A REACTION BY-PRODUCT

BACKGROUND OF THE INVENTION

1. Technical Field

The present invention relates to an exhaust pipe for a vacuum exhaust system, which is used for creating a vacuum in a vacuum chamber of, for example, a semiconductor manufacturing apparatus. More specifically, the present invention relates to an exhaust pipe having a means for preventing deposition of a reaction by-product on an inner surface of the exhaust pipe. The present invention also relates to a method for preventing deposition of a reaction by-product on an inner surface of an exhaust pipe.

2. Description of the Related Art

In a reduced-pressure chemical vapor-phase growth (CVD) apparatus, a reaction furnace (a vacuum chamber) in the form of a pipe made of quartz is provided, and a vacuum pump is connected to the reaction furnace through a metallic exhaust pipe. In such a reduced-pressure chemical vapor-phase growth apparatus, especially when it is applied to a process for forming an oxide film or a nitride film on a semiconductor substrate, a reaction by-product is produced in a large amount. The vacuum pump is contaminated with such a reaction by-product, with the result that the vacuum pump is likely to become inoperative in a short period of time. In order to avoid such a problem, a cleaning operation must be periodically conducted. However, such a requirement gives rise to a problem that an operative state of a reduced-pressure chemical vapor-phase growth apparatus is limited to a low rate.

To prevent a vacuum pump from becoming inoperative due to contamination with a reaction by-product, various types of traps that are provided in an exhaust pipe between the reaction furnace and the vacuum pump have been developed. Such traps are, to some extent, effective. However, in an exhaust pipe situated between the reaction furnace and the trap, there remains a problem of deposition and accumulation of a reaction by-product on an inner surface of the exhaust pipe. As a countermeasure, there has been proposed a heater in a spiral form provided on an outer surface of the exhaust pipe, so as to heat the exhaust pipe and therefore prevent condensation and deposition of reaction by-products on the inner surface of the exhaust pipe.

However, this method remains unsatisfactory, since heat generated by the heater escapes into the atmosphere and therefore the temperature of the exhaust pipe cannot be increased in an efficient manner. Especially, in a process for forming an oxide film, a sublimation temperature of the reaction by-product is high, and an amount of a reaction by-product is large, with the result that deposition of a reaction by-product cannot be effectively prevented.

SUMMARY OF THE INVENTION

In view of the stated problems of the conventional art, the present invention has been made. It is a primary object of the present invention to provide, in an exhaust pipe connecting a vacuum chamber and a vacuum pump, a means for preventing deposition of a reaction by-product, so as to avoid deposition and accumulation of the reaction by-product on the exhaust pipe, and to eliminate a need for periodic maintenance, to thereby increase an operation rate of the semiconductor manufacturing apparatus.

That is, the present invention provides an exhaust pipe that has a basic characteristic feature comprising: an inner cylinder having an exhaust gas passage formed therein; an outer cylinder provided outside the inner cylinder, with a gap being formed therebetween; and a heating means attached to the inner cylinder, the gap being communicated with the exhaust gas passage.

The gap between the inner cylinder and the outer cylinder is communicated with the exhaust gas passage. Therefore, when gas is discharged through the exhaust gas passage, a vacuum is created not only in the exhaust gas passage, but also in the gap between the inner cylinder and the outer cylinder. Consequently, release of heat to the outside from the heating means provided in the gap can be suppressed. In this way, the inner cylinder can be effectively heated, thus avoiding any reaction by-product contained in the discharged gas from being condensed and deposited on the inner surface of the inner cylinder.

According to one embodiment of the present invention, the inner cylinder is shorter than the outer cylinder. The inner cylinder is connected at an upstream-side end thereof to the outer cylinder, and has a communication opening formed at a downstream-side end thereof so as to allow communication between the gap and the exhaust gas passage. The inner cylinder may be connected at the downstream-side end thereof to the outer cylinder and have a communication opening formed at the upstream-side end thereof.

Further, by forming a layer of an inert gas or a nitrogen gas along an inner wall surface of the inner cylinder, condensation and deposition of the reaction by-product can be prevented more effectively. Specifically, a gas inlet opening for an inert gas or a nitrogen gas is provided so as to extend through the upstream-side end of the outer cylinder and the inner cylinder without being communicated with the gap, and the inert gas or the nitrogen gas is introduced through the gas inlet opening into the exhaust gas passage. The gas inlet opening may be formed at a downstream-side end of the outer cylinder so as to be communicated with the gap, and the inert gas or the nitrogen gas may be introduced through the gas inlet opening and guided through the gap and the communication opening into the exhaust gas passage. In this case, the heat from the heating means, which is to be diffused to the outside, is absorbed by the inert gas passed through the gap, and this gas serves to prevent deposition of a reaction by-product. Further, because the gas flows along the inner surface of the inner cylinder, the inner surface can be effectively heated.

According to another embodiment of the present invention, the inner cylinder and the outer cylinder have substantially the same length and are connected to each other at opposite ends thereof; a gas inlet opening communicated with the gap is provided in the outer cylinder; the inner cylinder is made of a porous material; and the inert gas is introduced through the gas inlet opening into the gap and ejected into the exhaust gas passage through a number of pores of the inner cylinder. By this arrangement, deposition of a reaction by-product can be prevented.

Further, in the present invention, an exhaust pipe is provided that comprises: an inner cylinder having an exhaust gas passage formed therein; an outer cylinder provided outside the inner cylinder; a sealable space formed between the inner cylinder and the outer cylinder; and a cooling medium inlet opening formed in the outer cylinder so as to introduce an ultra-low-temperature cooling medium such as liquid nitrogen into the sealable space.

In this exhaust pipe, an ultra-low-temperature cooling medium such as liquid nitrogen is supplied to the sealable space, to thereby cool the inner surface of the inner cylinder, and a gas such as an ammonia gas, an argon gas or a nitrogen gas is introduced into an area in the vicinity of the inner surface, to thereby freeze the gas on the inner surface. After discharging a gas from the vacuum chamber, the frozen gas is vaporized, to thereby separate the reaction by-product deposited in the frozen gas at a time that the gas is discharged from the vacuum chamber.

DETAILED DESCRIPTION OF THE INVENTION

Figure 1:
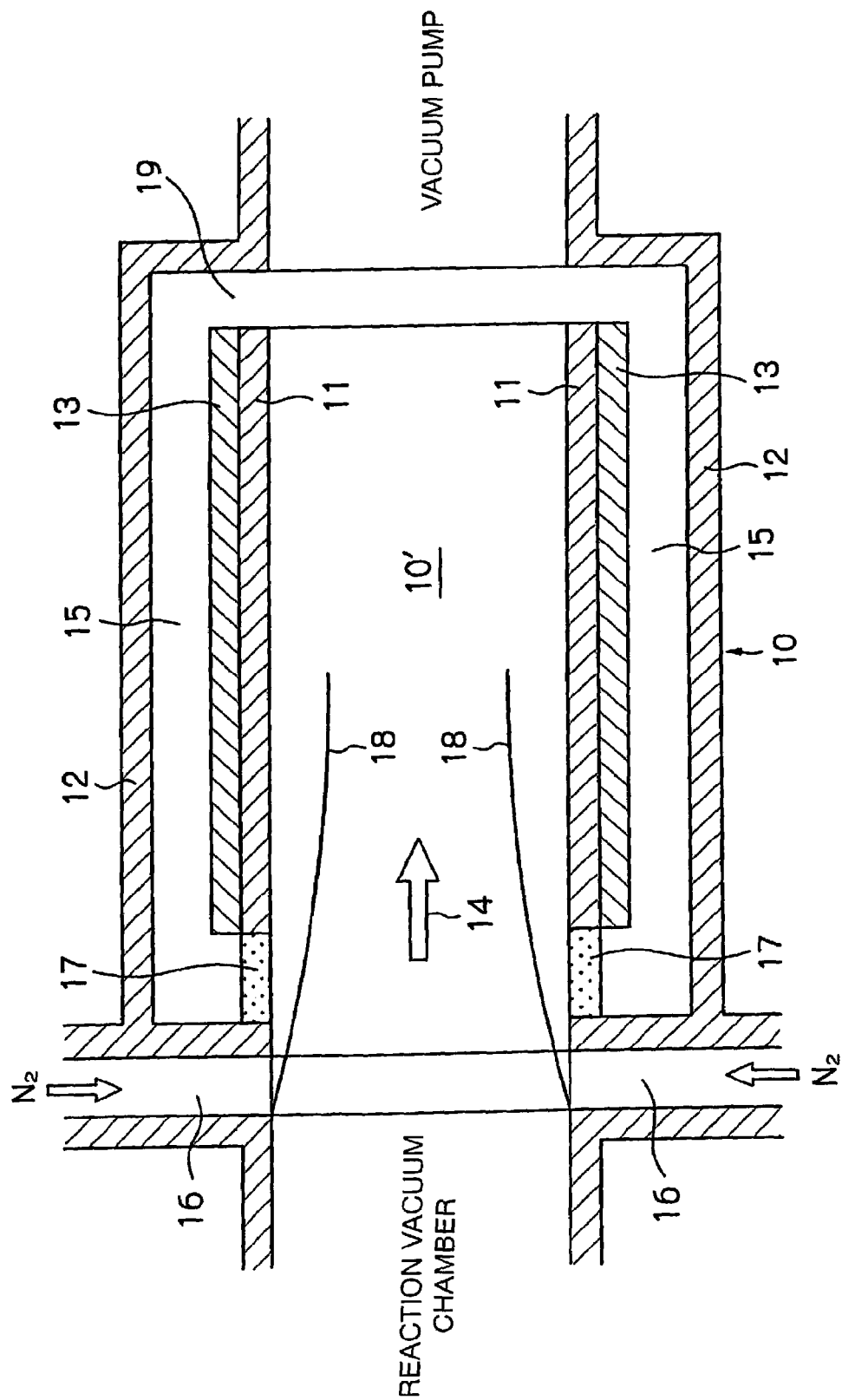
FIG. 1 shows an arrangement of an apparatus for preventing deposition of a reaction by-product on an exhaust pipe according to a first embodiment of the present invention.

Hereinbelow, referring to the drawings, explanation is made with regard to the embodiments of the present invention.

In FIG. 1, reference numeral 10 denotes an exhaust pipe according to an embodiment of the present invention. In this embodiment, a left end portion of the exhaust pipe 10 is connected to a reaction vacuum chamber (not shown), and a right end portion of the exhaust pipe 10 is connected to a vacuum pump (or a trap provided upstream of the vacuum pump, although not shown).

The exhaust pipe 10 has a dual structure comprising an inner cylinder 11 having an exhaust gas passage 10' formed therein and an outer cylinder 12 provided outside the inner cylinder 11 with a gap 15 being formed therebetween. A heating means 13 is provided on an outer circumferential surface of the inner cylinder 11 so as to heat the inner cylinder 11. Each of the inner cylinder 11 and the outer cylinder 12 is made of, for example, a metallic material. The inner and outer cylinders are connected to each other at respective end portions at an upstream side (the side closer to the reaction vacuum chamber). The upstream-side end portion of the inner cylinder 17 is formed from a heat insulating material 17, such as a ceramic material. The inner cylinder 11 is shorter than the outer cylinder 12. The downstream-side end portion of the inner cylinder 11 is not connected to the outer cylinder 12. An annular communication opening 19 is formed so as to enable the gap 15 between the inner cylinder 11 and the outer cylinder 12 (actually an outer circumferential surface of the heating means 13 and an inner circumferential surface of the outer cylinder 12) to communicate with the exhaust gas passage 10'. Further, a gas inlet opening 16 is formed at the upstream-side end portion of the exhaust pipe 10 so as to introduce an inert gas (such as an argon gas) or a nitrogen ($N_2$) gas into the inner cylinder 11.

In the exhaust pipe having the above-mentioned arrangement, when gas is discharged from the reaction vacuum chamber by means of the vacuum pump, the gas flows from the reaction vacuum chamber in a direction indicated by an arrow 14, thus creating a vacuum in the reaction vacuum chamber. In this instance, the inner cylinder 11 is heated by the heating means 13. Because a vacuum is created not only in the exhaust gas passage 10' in the inner cylinder 11, but also in the gap 15 communicated with the exhaust gas passage 10', release of heat from the heating means 13 to the outside can be minimized. Consequently, the inner cylinder 11 can be readily heated to a high temperature (300° C. or more).

Thus, an inner wall surface of the inner cylinder 11 is maintained at a high temperature, so that condensation of the reaction by-product does not occur, and deposition and accumulation of the reaction by-product on the inner wall surface can be prevented. Further, an inert gas or a nitrogen gas is introduced from the gas inlet opening 16 along the inner wall surface of the inner cylinder 11, to thereby form a gas flow layer 18 along the inner wall surface. This also serves to prevent deposition of a reaction by-product on the inner wall surface. As the heating means 13, various heating means such as an electric heater and an oil heater can be employed, as long as they are capable of heating the inner cylinder 11 to a sufficiently high temperature.

When an exhaust pipe having a great length is used, there is a possibility that the gas flow layer 18 of an inert gas or a nitrogen gas will be peeled off from the inner wall surface of the exhaust pipe 10 (the inner wall surface of the inner cylinder 11). In order to avoid this situation, such an exhaust pipe may be formed by connecting a plurality of exhaust pipes 10 in tandem, having the above-mentioned arrangement.

Figure 2:
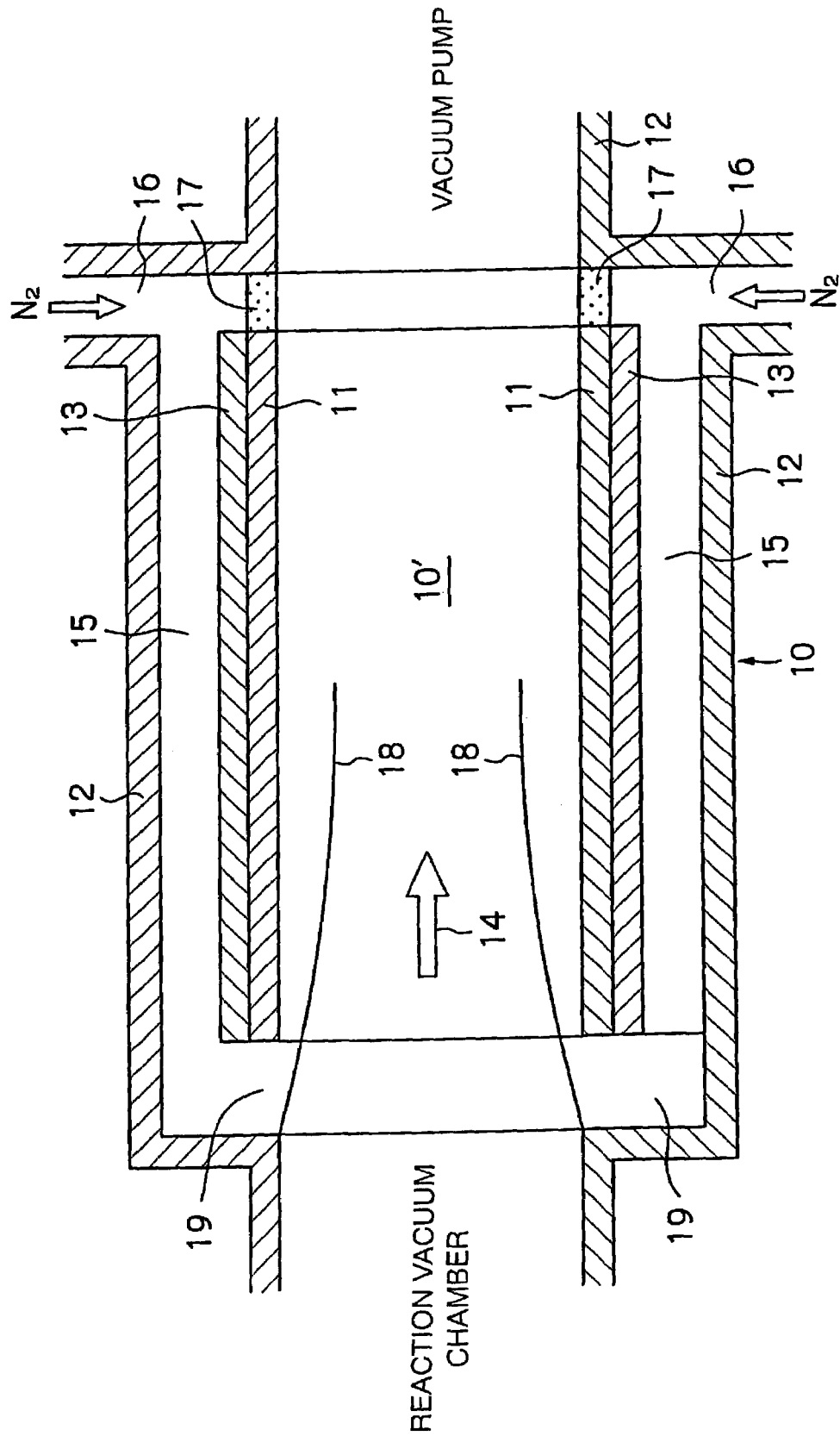
FIG. 2 shows an arrangement of an apparatus for preventing deposition of a reaction by-product on an exhaust pipe according to a second embodiment of the present invention.

FIG. 2 shows an exhaust pipe according to a second embodiment of the present invention. In FIG. 2, like elements which are the same as or correspond to those shown in FIG. 1 are denoted by like reference numerals and characters, as used in FIG. 1. The same applies to the other drawings. In FIG. 2, the inner cylinder 11 and the outer cylinder 12 are connected to each other at respective end portions at a downstream side (the side closer to the vacuum pump), which is opposite to the case of FIG. 1. The downstream-side end portion of the inner cylinder 11 is formed from the heat insulating material 17 such as a ceramic material. The annular communication opening 19 is open at the upstream-side end portion of the inner cylinder 11. The gas inlet opening 16 for introducing an inert gas or a nitrogen gas into the gap 15 is formed at the downstream-side end portion of the outer cylinder 12. The gas that has been introduced from the gas inlet opening 16 into the gap 15 is passed through the communication opening 19 to the exhaust gas passage 10' in the inner cylinder 11.

In the exhaust pipe in the second embodiment, when gas is discharged from the reaction vacuum chamber by means of the vacuum pump, an inert gas or a nitrogen gas is introduced through the gas inlet opening 16 into the exhaust pipe 10, while heating the inner cylinder 11 by the heating means 13. The gas thus introduced is passed through the gap 15 while being heated by the heating means 13, and passed through the communication opening 19 so as to form the gas flow layer 18 along the inner surface of the inner cylinder. Therefore, the inner cylinder 11 is efficiently heated to a temperature as high as 300° C. or more by the heating means. Consequently, condensation of a reaction by-product on the inner surface of the inner cylinder does not occur, thus preventing deposition and accumulation of the reaction by-product.

Further, in order to prevent peeling-off of the gas flow layer 18 of an inert gas or a nitrogen gas formed along the inner wall surface of the exhaust pipe 10 (the inner wall surface of the inner cylinder 11) shown in FIG. 2, an exhaust pipe may be formed by connecting a plurality of exhaust pipes 10 in tandem.

Figure 3:
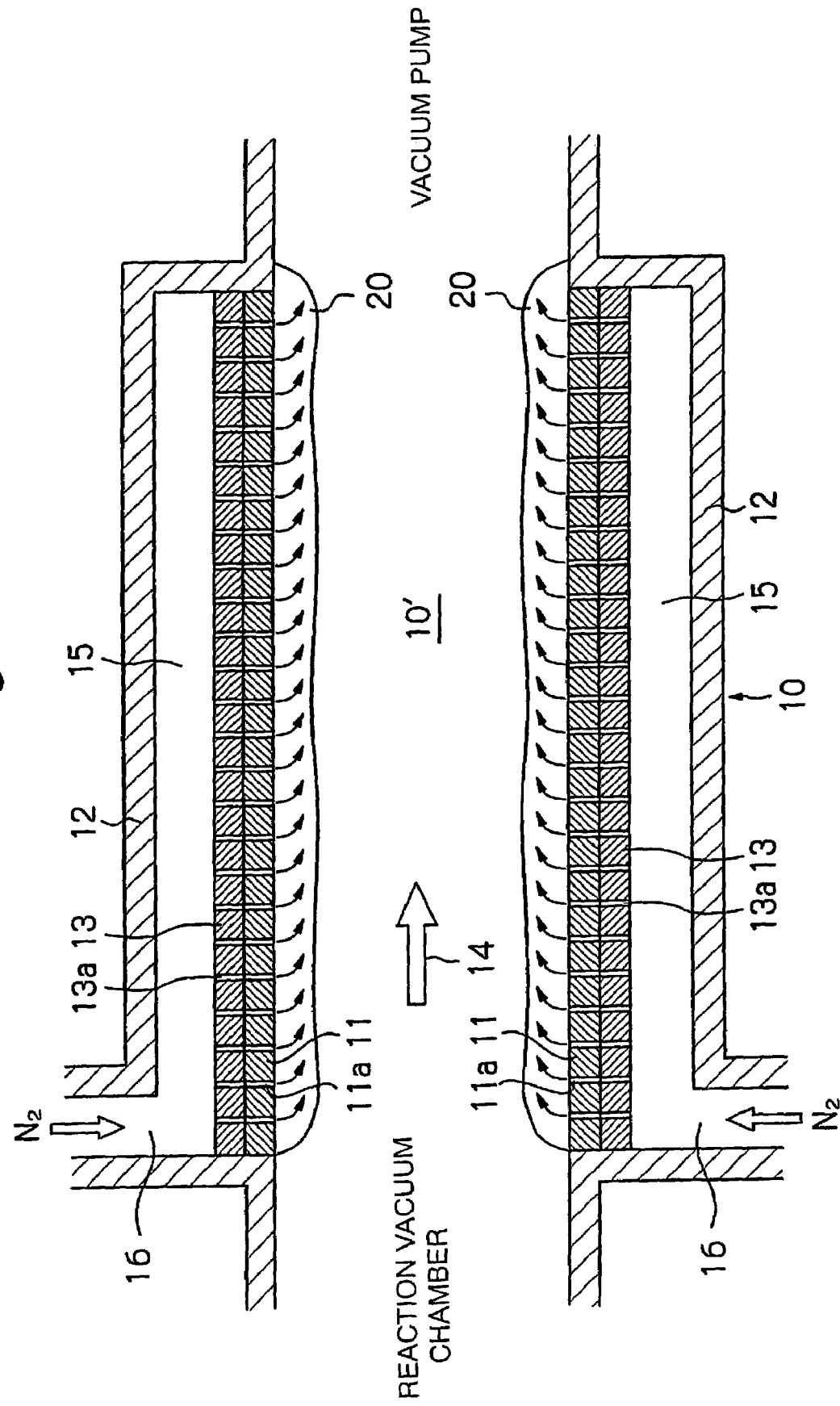
FIG. 3 shows an arrangement of an apparatus for preventing deposition of a reaction by-product on an exhaust pipe according to a third embodiment of the present invention.

FIG. 3 shows an exhaust pipe according to a third embodiment of the present invention. As shown in FIG. 3, the exhaust pipe 10 has a dual structure comprising the inner cylinder 11 and the outer cylinder 12. The third embodiment is characterized in that the inner cylinder 11 is made of a porous material having a number of pores 11a (a material in which pores 11a have been formed, or a porous ceramic material), the heating means 13 is also made of a porous material having a number of pores 13a, and the inner cylinder 11 and the outer cylinder 12 have the same length and are connected to each other at opposite end portions thereof.

In this exhaust pipe, when gas is discharged from the reaction vacuum chamber by means of the vacuum pump, as in the the above embodiments, an inert gas or a nitrogen gas is introduced into the exhaust pipe 10 through the gas inlet opening 16, while heating the inner cylinder 11 by the heating means 13. The gas thus introduced is passed through the pores 13a and the pores 11a of the heating means 13 and the inner cylinder 11 each formed from a porous material, and enters the exhaust gas passage 10'. In the exhaust gas passage 10', a jet layer 20 is formed along the inner surface of the inner cylinder 11. Therefore, the inner cylinder 11 is efficiently heated by the heating means, and the inner surface of the inner cylinder 11 is heated to a temperature as high as 300° C. or more. Consequently, the reaction by-product does not condense on the inner surface of the inner cylinder, whereby deposition and accumulation of reaction by-product can be prevented. The pore area ratio of the porous material may be either specific or unspecific. In order to obtain a uniform gas flow layer in the exhaust pipe, in the case of FIG. 3, it is preferred that the pore area ratio at a position remote from the gas inlet opening 16 is lower than that at a position close to the gas inlet opening 16.

Figure 4:
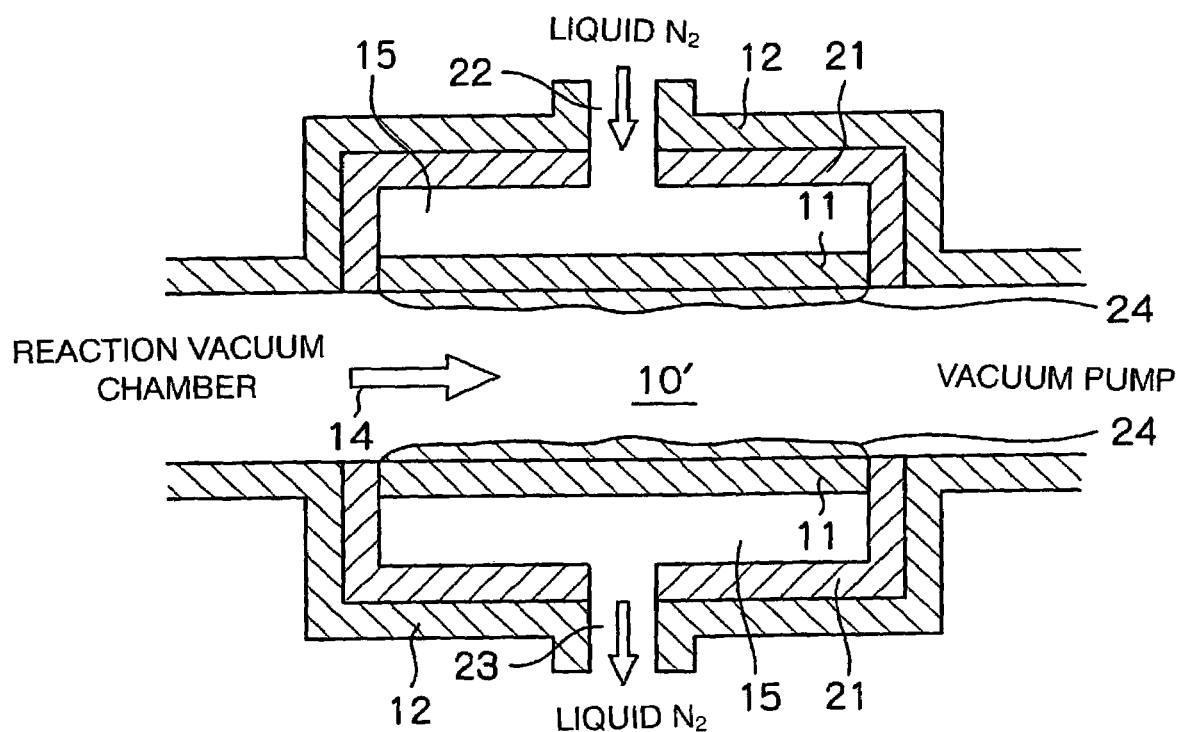
FIG. 4 shows an arrangement of an apparatus for preventing deposition of a reaction by-product on an exhaust pipe according to a fourth embodiment of the present invention.

FIG. 4 shows an exhaust pipe according to a fourth embodiment of the present invention. This exhaust pipe 10 in the fourth embodiment has a dual structure comprising the inner cylinder 11 and the outer cylinder 12. A heat insulating material 21 is provided on the inner wall surface of the outer cylinder 12. Opposite ends of the inner cylinder 11 are connected to the outer cylinder 12 through the heat insulating material 12. In the gap 15 formed between the inner surface of the heat insulating material 21 and the outer circumferential surface of the inner cylinder 11, there is provided a cooling medium inlet opening 22 for introducing an ultra-low-temperature cooling medium such as liquid nitrogen into the gap 15 and a cooling medium outlet opening 23 for discharging the cooling medium from the gap 15.

When gas is discharged from the reaction vacuum chamber, an ultra-low-temperature cooling medium such as liquid nitrogen is preliminarily supplied to the gap 15, to thereby cool the inner cylinder 11. In this state, an ammonia gas, an argon gas or a nitrogen gas is introduced into the exhaust pipe 10. The gas is condensed on the inner surface of the inner cylinder 11, to thereby form a condensation layer (a solid layer) 24.

After completion of the process of a reaction, the supply of the cooling medium to the gap 15 is stopped, and the cooling medium in the gap is discharged, thus stopping cooling of the inner cylinder 11. By this arrangement, the condensation layer 24, which has been formed before the process of the reaction, is vaporized. The reaction by-product which has been deposited on the condensation layer when gas is discharged from the reaction vacuum chamber is separated from the inner surface of the inner cylinder, by vaporization of the condensation layer 24. The separated reaction by-product is discharged from the exhaust pipe.

In the exhaust pipe 10, deposition of the reaction by-product can be prevented in the above-mentioned manner. Therefore, there is no need for maintenance such as cleaning of the exhaust pipe 10. By applying the exhaust pipe of the present invention to a semiconductor manufacturing apparatus, the operation rate of the apparatus can be markedly increased.

INDUSTRIAL APPLICABILITY

The exhaust pipe of the present invention is usable in a process for forming an oxide film or a nitride film on a semiconductor substrate in a vacuum chamber, by using a reduced-pressure chemical vapor-phase growth apparatus. Specifically, the exhaust pipe of the present invention is suitable for use in the case of a reaction by-product being produced in a large amount when gas is discharged from the vacuum chamber. Further, the exhaust pipe of the present invention can be effectively utilized when a floating material contained in the discharged gas is likely to be deposited on the inner surface of the exhaust pipe and constitute an impediment. For example, the exhaust pipe can be applied to a process for forming an AsSg (arsenic glass) film. In this case, deposition of As (arsenic) on the inner surface of the exhaust pipe can be prevented, so that there is no possibility of an operator being exposed to As during maintenance of the exhaust pipe.

The invention claimed is:

1. A method for preventing deposition of a reaction by-product on an exhaust pipe which is used for discharging a gas from a reaction vacuum chamber, wherein the exhaust pipe has a dual structure comprising an inner cylinder and an outer cylinder with a gap being form therebetween, and the gap is communicated with a space inside the inner cylinder, the method comprising:

discharging a gas from the inner cylinder;

heating an inner wall surface of the inner cylinder to a predetermined temperature by a heating means disposed on an outer surface of the inner cylinder so as to prevent deposition of the reaction by-product, wherein the inner cylinder and the outer cylinder are connected to each other through a heat insulating material; and forming a gas layer of an inert gas or nitrogen gas along the inner wall surface of the inner cylinder, wherein the gas forming the gas layer is supplied through a gas inlet passage extending through the upstream-side end of the outer cylinder and the inner cylinder without being communicated with the gap, and the gas inlet passage opens at the inner wall surface of the inner cylinder to supply the inert gas or the nitrogen gas into the inner cylinder.

2. The method according to claim 1, further comprising creating a vacuum in the gap between the inner cylinder and the outer cylinder, to thereby suppress transmission of heat from the inner cylinder to the outer cylinder.

3. The method according to claim 2, wherein in order to create a vacuum in the gap, the gap is communicated with the exhaust gas passage, to thereby introduce, into the gap, a vacuum created in the exhaust gas passage for discharging the gas from the vacuum reaction chamber.

4. The method according to claim 3, wherein the inner cylinder is shorter than the outer cylinder; and the inner cylinder is connected by the insulating material at an upstream-side end thereof to the outer cylinder and has a communication opening formed at a downstream-side end thereof so as to allow communication between the gap and the exhaust gas passage.

* * * * *